(12) United States Patent  
Bateman et al.

(10) Patent No.: US 9,330,917 B2
(45) Date of Patent: May 3, 2016

(54) PASSIVATION LAYER FOR WORKPIECES FORMED FROM A POLYMER

(71) Applicant: Varian Semiconductor Equipment Associates, Inc., Gloucester, MA (US)

(72) Inventors: Nicholas Bateman, Reading, MA (US); Deepak Ramappa, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 46 days.

(21) Appl. No.: 13/771,774

(22) Filed: Feb. 20, 2013

(65) Prior Publication Data

US 2013/0224938 A1     Aug. 29, 2013

Related U.S. Application Data

(60) Provisional application No. 61/602,959, filed on Feb. 24, 2012.

(51) Int. Cl.
*H01L 21/265* (2006.01)
*H01L 31/0216* (2014.01)
*H01L 31/18* (2006.01)

(52) U.S. Cl.
CPC ........ *H01L 21/265* (2013.01); *H01L 31/02167* (2013.01); *H01L 31/1868* (2013.01); *Y02E 10/50* (2013.01); *Y02P 70/521* (2015.11)

(58) Field of Classification Search
CPC .................................................... H01L 21/265
See application file for complete search history.

(56) References Cited

U.S. PATENT DOCUMENTS

| 2003/0168701 A1 | 9/2003 | Voldman |
| 2010/0206371 A1 | 8/2010 | Janz et al. |
| 2011/0104389 A1* | 5/2011 | Bryan-Brown et al. ...... 427/510 |
| 2012/0321854 A1 | 12/2012 | Therrien et al. |

FOREIGN PATENT DOCUMENTS

WO    2011/068884 A2    6/2011

OTHER PUBLICATIONS

Migajima, et al., "Properties of n-type hydrogenated noncrystalline cubic silicon carbide films deposited by VHF-PECVD at a low substrate temperature," J. Non-Crystalline Solids, 354 (2008), 2350-2354.
International Search Report and Written Opinion, for PCT/US2013/027085, mailed Jun. 13, 2013, 13 pages.

* cited by examiner

*Primary Examiner* — Alexander Ghyka

(57) ABSTRACT

Methods of forming a passivation layer on a workpiece are disclosed. These methods utilize a SiC forming polymer to form the passivation layer. In addition, while the polymer is being heated to form SiC, a second result, such as annealing of the underlying workpiece, or firing of the metal contacts is achieved. For example, the workpiece may be implanted prior to coating it with the polymer. When the workpiece is heated, SiC is formed and the workpiece is annealed. In another embodiment, a workpiece is coating with the SiC forming polymer and metal pattern is applied to the polymer. The firing of workpiece causes the metal contacts to form and also forms SiC on the workpiece.

13 Claims, 7 Drawing Sheets

PASSIVATION LAYER FOR WORKPIECES FORMED FROM A POLYMER

This application claims priority from U.S. Provisional Patent Application Ser. No. 61/602,959 filed Feb. 24, 2012, the disclosure of which is incorporated herein by reference in its entirety.

FIELD

This invention relates to a passivation layer for use with a workpiece that is formed from a polymer.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a workpiece. Lower production costs for high-performance solar cells or any efficiency improvement to high-performance solar cells would have a positive impact on the implementation of solar cells worldwide. This will enable the wider availability of a clean energy technology.

Silicon carbide may provide better passivation for solar cells than other materials, such as silicon oxide or nitrides. However, silicon carbide has traditionally been applied using plasma-enhanced chemical vapor deposition (PECVD), which is a slow and costly process.

What is needed is a new method of forming a passivation layer on a workpiece and, more particularly, using a passivation layer for solar cells formed from a polymer.

SUMMARY

New methods of forming a passivation layer on a workpiece are disclosed. These methods utilize a SiC forming polymer to form the passivation layer. In addition, while the polymer is being heated to form SiC, a second result, such as annealing of the underlying workpiece, or firing of the metal contacts is achieved.

In one embodiment, the method of processing a workpiece comprises implanting ions of a first species into a first surface of the workpiece to form a doped region; coating at least a portion of the first surface with a SiC forming polymer after the implanting step; and thermally treating the workpiece after the coating step to anneal the doped region and form SiC on the first surface.

In another embodiment, the method of processing a workpiece comprises coating at least a portion of a first surface with a SiC forming polymer; applying a metal pattern on said first surface after the coating step; and firing the workpiece after the applying step so as to form metal contacts and form SiC from the polymer.

In another embodiment, the method of processing a workpiece comprises coating a first surface with a SiC forming polymer, the polymer comprising a dopant; and thermally treating the polymer so as to form SiC and diffuse the dopant into the workpiece.

BRIEF DESCRIPTION OF THE DRAWINGS

For a better understanding of the present disclosure, reference is made to the accompanying drawings, which are incorporated herein by reference and in which.

DETAILED DESCRIPTION

The processes are described herein in connection with solar cells. However, the processes can be used with other workpieces such as optical sensors, semiconductors, or light-emitting diodes (LEDs). The solar cells may be silicon or other materials. While particular n-type and p-type dopants are mentioned, other species known to those skilled in the art also may be used. Other variations of the process flow embodiments described herein may be possible. Thus, the invention is not limited to the specific embodiments described below.

Poly(silylenemethylene) is a polymer containing silicon and carbon in similar atomic proportions. This polymer can be coated on a workpiece. In one particular instance, a device such as an inkjet printer, spin coater, spray coater, or screen printer may be used to print the polymer on the workpiece in a particular pattern. When the workpiece is heated, such as to a temperature greater than approximately 700° C., the polymer forms silicon carbide (SiC), which may be used to passivate the workpiece. The SiC may be amorphous or have other crystal structures. This workpiece may be, for example, a solar cell.

Figure 1:
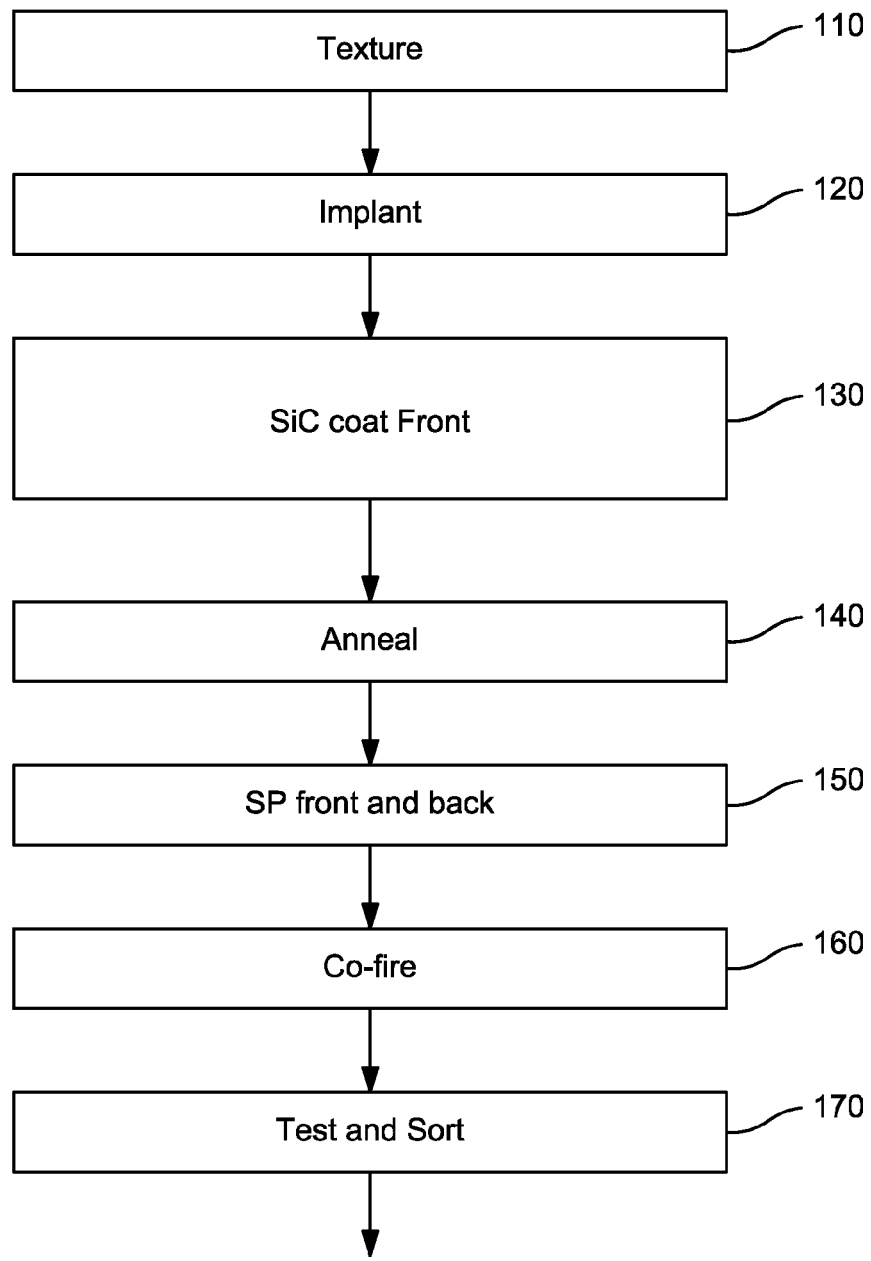
FIG. 1 is a process flow of a first embodiment of solar cell fabrication.

FIG. 1 is a process flow of a first embodiment of solar cell fabrication. This may be used to manufacture, for example, conventional or selective emitter (SE) solar cells. After surface texturing, shown in step 110, the solar cell is implanted, as seen in step 120, to create an emitter, though gas or solid source diffusion also may be used. This implant could be a blanket or patterned implant. For example, a p-type solar cell may be implanted with phosphorus or an n-type solar cell may be implanted with boron. Of course, other dopants may be used to create the desired conductivity of the emitter. The emitter is then coated with the SiC-forming polymer, as shown in step 130. This polymer may be poly(silylenemethylene) or some other polymer that can be used to form SiC known to those skilled in the art. For passivation, approximately 10 nm or more of the SiC-forming polymer is applied. In one instance, approximately 55 nm of the SiC-forming polymer is applied.

This coating may be patterned or may be uniform (blanket) across the emitter. If the coating is patterned, an ink jet printer, masked spray coat system, screen printer, or other system may be used in one instance. A thermal step 140 is used to anneal the implant damage underneath and form the SiC from the SiC-forming polymer. In one instance, this thermal step 140 may be between approximately 600° C. to 900° C. Other thermal treatments may also be employed, as described below. Screen printing (SP), shown in step 150, may be used to add a metal pattern. The metal pattern is co-fired, as seen in step 160. The term "co-fired" refers to the process of firing the front and back contacts at the same time. In other words, a single thermal process is used to form the metal on the front and back sides, even through the paste chemistries may be different. The solar cell is tested and sorted as shown in step 170. If the SiC coating applied in step 130 is uniform across the entire surface, a fritted paste can be used for metallization so that the frit drives through the SiC coating. If the SiC coating applied in step 130 has a pattern to match the metal pattern, a self-doping unfritted paste can be used for metallization to provide excess dopant under the metal lines. If the SiC coating has a pattern to match the metal pattern, plating or deposition of the metal may be performed in an alternate embodiment. For clarity, throughout this disclosure, in certain embodiments, the coating pattern is said to match the metallization pattern. This expression refers to the instance where the coating is applied in those areas where metal is not to be applied. In other words, the coating pattern is a negative or inverse image of the metallization pattern.

In each of the following processes, those process steps that are common to the process flow shown in FIG. 1 are given the same reference designators.

Figure 2:
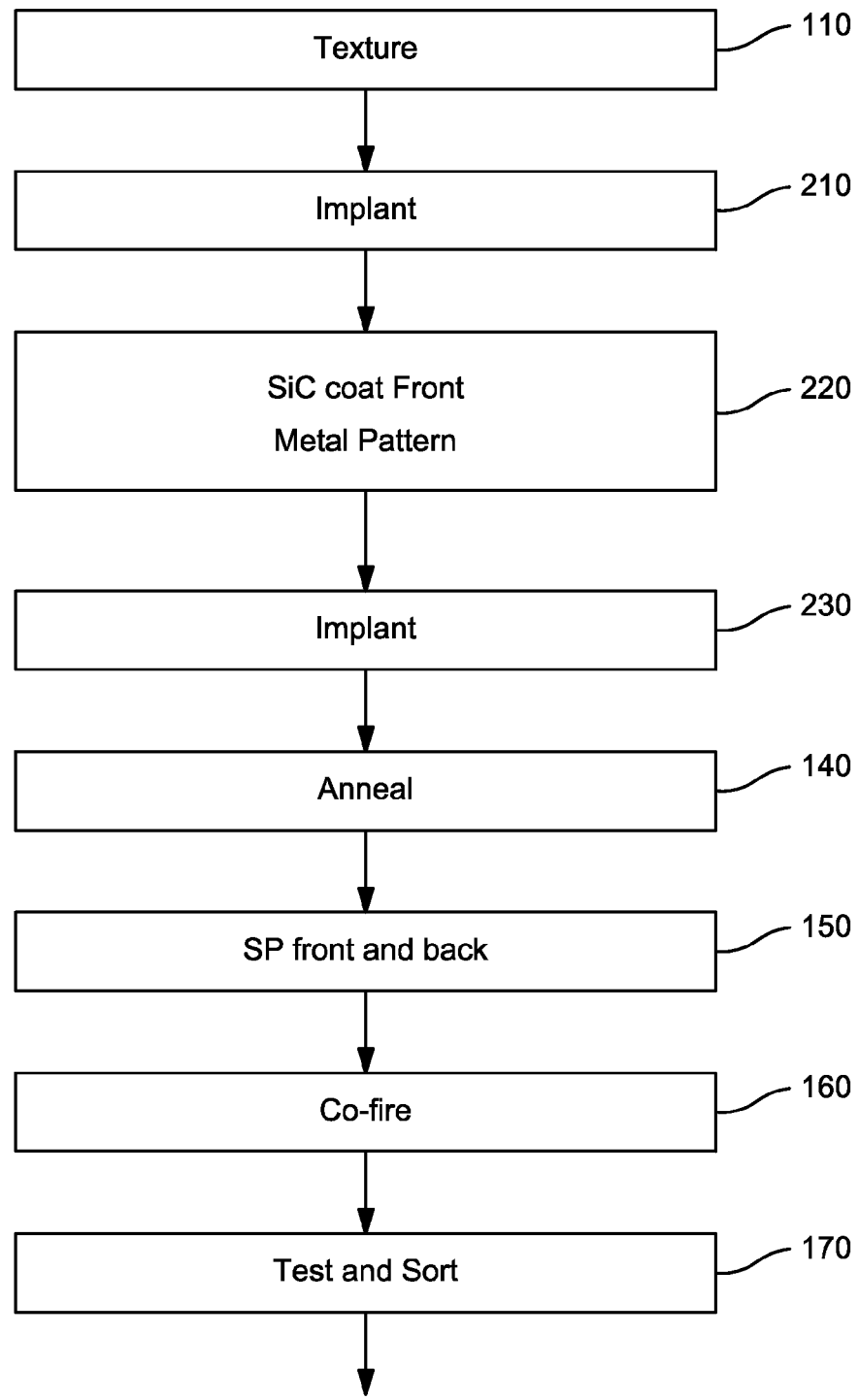
FIG. 2 is a process flow of a second embodiment of solar cell fabrication.

FIG. 2 is a process flow of a second embodiment of solar cell fabrication. In this embodiment, during implant step 210, a lower dose may be implanted after texturing, as compared to implant step 120 in the embodiment of FIG. 1. The SiC-forming polymer is patterned on the solar cell to match the eventual metal pattern, as shown in step 220. As shown in step 230, an implant of a second species that either is the same as that used for the first implant 210 or is a dopant with the same conductivity as that used for the first implant 210 is then performed. This provides a larger dopant dose between gaps in the coating of the SiC-forming polymer. The SiC-forming polymer will act as a mask in this instance. For example, more than approximately 10 nm thickness of the SiC-forming polymer may be needed to block a 10 kV boron implant. However, the thickness needed to block an implant is dependent on the implant species and implant energy and, thus, can vary. A single thermal step 140 is used to anneal the implant damage and form SiC. Metal is applied to match the SiC pattern using screen printing, plating or deposition, as shown in step 150.

Figure 3:
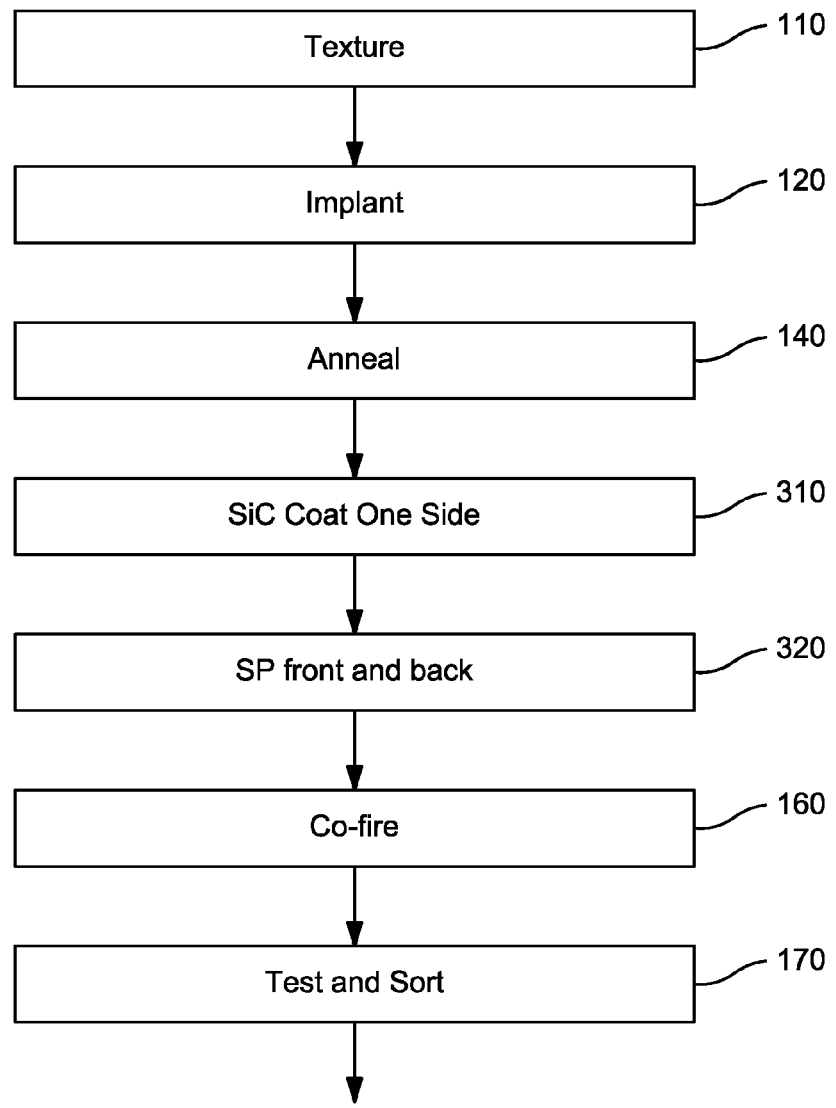
FIG. 3 is a process flow of a third embodiment of solar cell fabrication.

FIG. 3 is a process flow of a third embodiment of solar cell fabrication. In this embodiment, the emitter is formed using an implant step 120, though gas or solid source diffusion also may be used. After an anneal step 140, the entire front surface and/or back surface of the solar cell is coated with the SiC-forming polymer, as shown in step 310. A fritted metal paste is then applied using a screen printer, as shown in step 320 and the solar cell is fired in step 160. The firing step 160 forms SiC and activates the frit such that it drives the metal through the SiC. In an alternate embodiment, the SiC-forming polymer is applied in a pattern to match the metallization and an unfritted doped paste is used. The SiC is formed during firing and the doped paste adds dopant under the metal.

Figure 4:
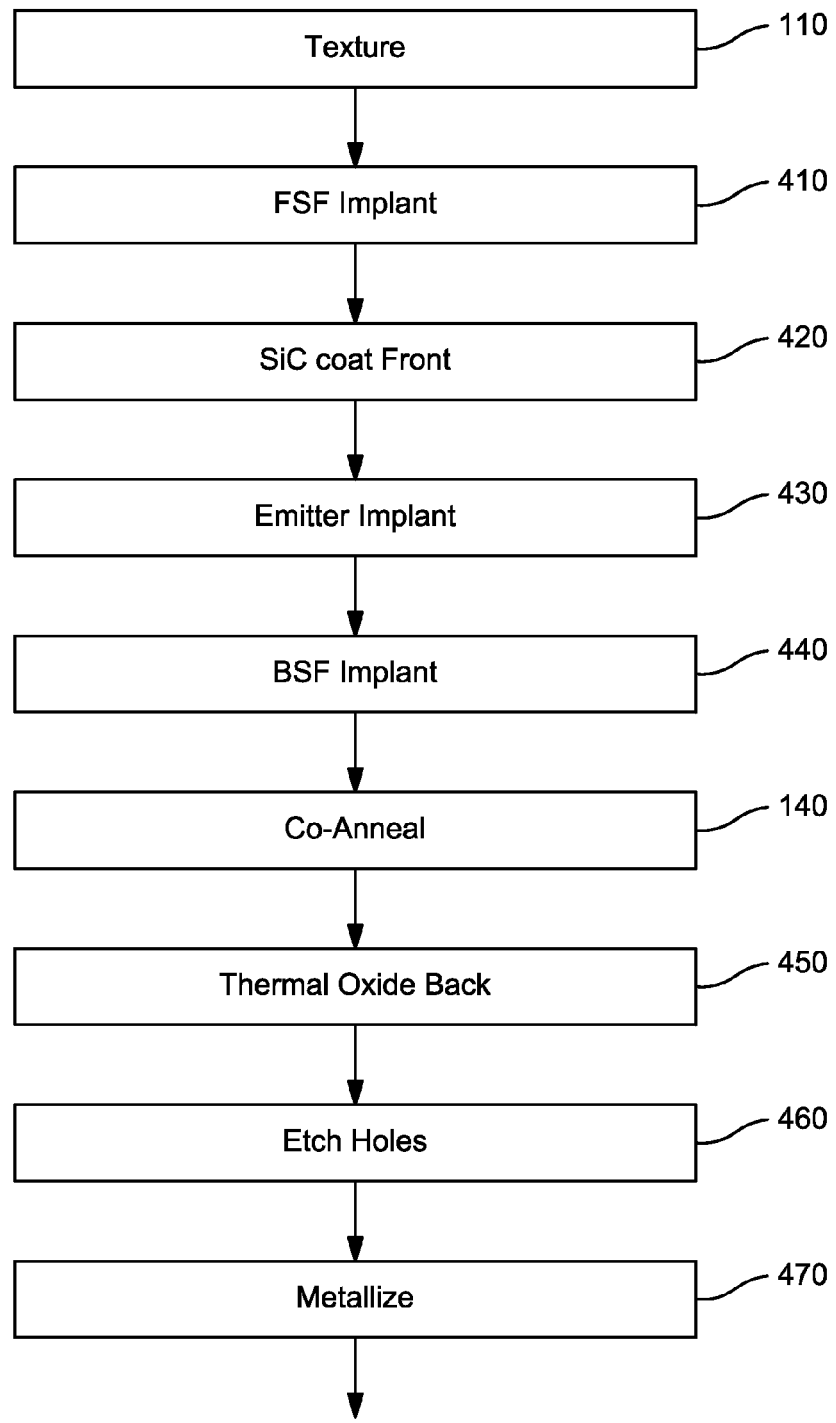
FIG. 4 is a process flow of a fourth embodiment of solar cell fabrication.

FIG. 4 is a process flow of a fourth embodiment of solar cell fabrication. This may be used to manufacture an interdigitated back contact (IBC) solar cell. After an implant step 410 to form front surface fields (FSF), which may use phosphorus, the solar cell is coated with the SiC-forming polymer, as shown in step 420. An emitter implant step 430, which may use boron, and a patterned back side implant step 440, which may use phosphorus, of the solar cell also may be performed after the SiC-forming polymer is applied. During the thermal step 140, SiC is formed and implant damage on both sides of the solar cell is removed.

The front side implant 410, thermal step 140, and coating 420 can be performed separately from the back side processing, which includes emitter implant 430 and BSF implant 440. This may be either before or after the back side processing. If both implants are annealed at the same time (i.e. co-annealed), oxygen can be introduced to grow an oxide on the back side, as shown in step 450. The SiC coating will prevent oxide growth on the front side, so a thick oxide can be grown on the back side to provide good reflection. In step 460, holes are then etched through layers on the solar cell surface and metallization is performed in step 470.

FIGS. 5A-D are various process flows of a fifth embodiment of solar cell fabrication. This embodiment relates to coating the back side of a solar cell, such as an IBC solar cell, with the SiC-forming polymer. The back side may be coated after the back side implants are complete, which may be after any front side implants, such as those used to form the FSF. In all of these embodiments, the solar cell is textured, in step 510. A dopant, such as phosphorus, is implanted in step 520 to create a front side field. An implant step 530 is used to create the emitter. The dopant used during implant step 530 may be boron in one embodiment. The back side field may be created using an implant step 540. This implant step 540 may utilize phosphorus in one embodiment. In all embodiments, a thermal step 560, such as an anneal is performed. In addition, a silicon nitride (SiN) coating is deposited in step 580 on the entire front side of the solar cell in all embodiments.

Figure 5:
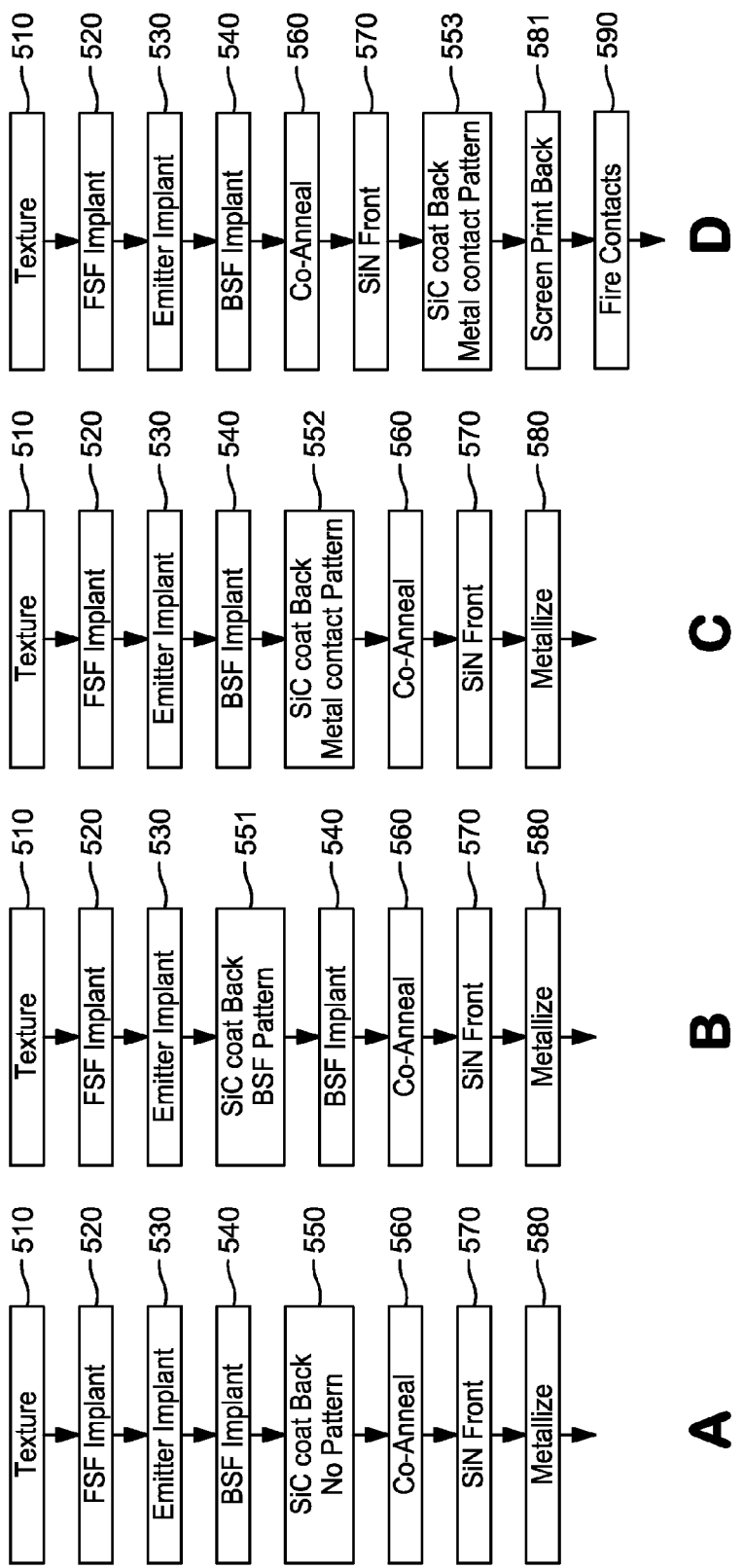
FIGS. 5A-D are various process flows of a fifth embodiment of solar cell fabrication.

In FIG. 5A, the entire back side is coated with the SiC-forming polymer in step 550 after the back side implants 530, 540 are completed. A single thermal step 560 anneals the implant damage and forms SiC. This SiC layer provides passivation of the emitter; however a thicker coating may also provide enhanced reflection. Another benefit is that the cost of this technique is independent of the coating thickness, unlike traditional deposition techniques. The front side doping step 520 may be performed either before or after the back side doping steps 530, 540. The front side may be annealed at the same time during the same thermal step 560 in one instance.

In FIG. 5B, the back emitter is formed using an implant step 530, which may use boron and may be either a blanket or patterned implant. The SiC-forming polymer is then applied in a pattern that matches the back surface field (BSF) pattern in step 551. This SiC-forming polymer is used as a mask for a second back side implant 540, which may use phosphorus. The openings in the SiC provide access to the silicon in the solar cell for the BSF metal, whereas the emitter metal openings may be formed using an etch or laser ablation step. The BSF is aligned with the metallization step 580. Both implants are annealed in a single step 560, which also forms the SiC. The front side doping 520 may be performed either before or after the back side doping 530, 540. The front side may be annealed at the same time during the same thermal step 560 in one instance.

In FIG. 5C, both the emitter implant 530 and BSF patterned implant 540 are performed before the SiC-forming polymer is applied in step 552. The SiC-forming polymer is applied in a pattern that leaves holes for the metal contacts to both the BSF and emitter. This may entail ink jet printing or screen printing. This screen printing may use at least two screens to form the desired pattern. The implants are annealed in step 560 and SiC is formed. Holes in the SiC are used for the metallization step 580 using, for example, plating, deposition, or screen printing. The front side doping 520 may be performed either before or after the back side doping 530, 540. The front side may be annealed at the same time during the same thermal step 560 in one instance. If the front side doping 520 is performed after the back side doping 530, 540, then the oxide is grown over the silicon in such a way that contacting is not prevented.

In FIG. 5D, all parts of the IBC solar cell are doped using, for example, implant or diffusion. After junction formation, the back side is coated in step 553 with the SiC-forming polymer with a pattern that matches the desired metal contact pattern. After drying, metal pastes are screen printed onto the back side in step 581. These pastes may not include frits that attack the SiC, but may contain dopants to increase dopant concentration at the metal contact. A subsequent firing step 590 will form metal contacts and SiC.

Figure 6:
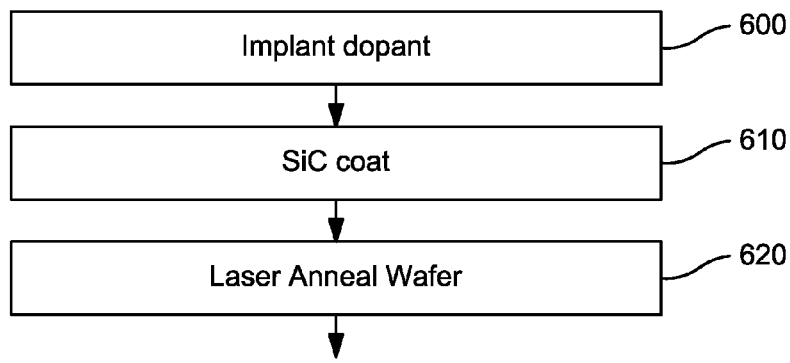
FIG. 6 is a process flow of a sixth embodiment of solar cell fabrication.

FIG. 6 is a process flow of a sixth embodiment of solar cell fabrication. In this embodiment, an n-type or p-type dopant is implanted to form a junction during step 600. SiC-forming polymer is applied in step 610 and a laser treatment is performed in step 620. The laser treatment 620 melts the silicon while the SiC-forming polymer is heated. The melted silicon removes implant damage, and activates the dopant, while the heat also forms a SiC coating. The embodiment of FIG. 6 may be combined with other embodiments disclosed herein.

Figure 7:
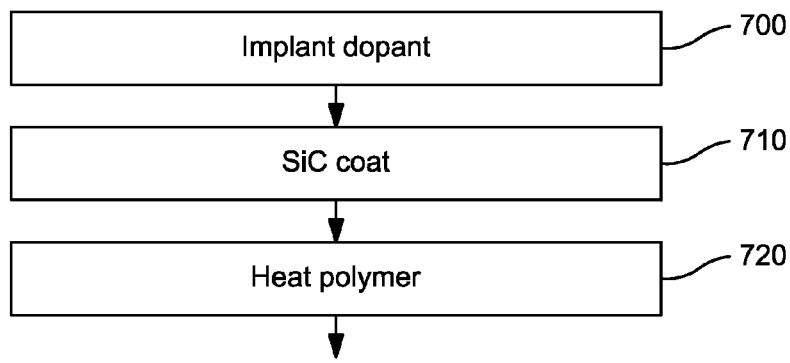
FIG. 7 is a process flow of a seventh embodiment of solar cell fabrication.

FIG. 7 is a process flow of a seventh embodiment of solar cell fabrication. A dopant is implanted into the solar cell in step 700 and the SiC-forming polymer is applied in step 710. The SiC-forming polymer is then heated in step 720 in a manner such that the solar cell is not heated directly. The temperature of the SiC-forming polymer is raised as it forms SiC. As the SiC-forming polymer forms SiC, the heat from the SiC-forming polymer will anneal the implant damage beneath it. Radiation that is mostly or fully absorbed by the SiC-forming polymer may be used. For example, a blue or UV laser using a wavelength less than approximately 500 nm may be used in one instance. Microwave irradiation may be used in another instance. The embodiment of FIG. 7 may be combined with other embodiments disclosed herein.

Figure 8:
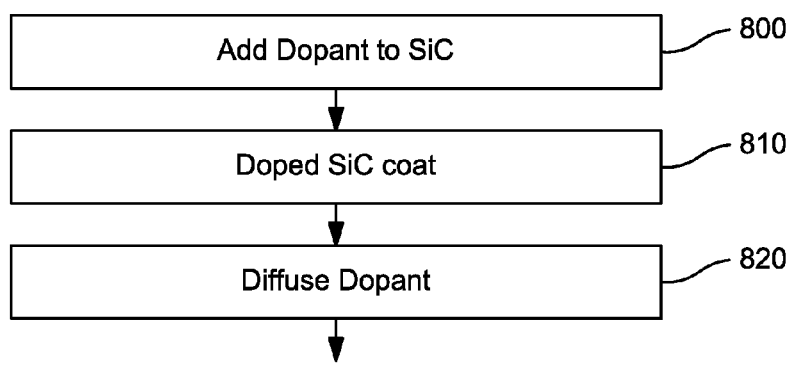
FIG. 8 is a process flow of an eighth embodiment of solar cell fabrication.

FIG. 8 is a process flow of an eighth embodiment of solar cell fabrication. The SiC-forming polymer is used as a diffusion source. A dopant can be added to the SiC-forming polymer, as shown in step 800. In one instance, silicon nanoparticles that contain a dopant, such as arsenic, boron, phosphorus, or other species, may be added. The SiC-forming polymer is then coated on the surface, as shown in step 810. A thermal treatment 820 is then performed. The thermal process causes SiC to be formed and causes the dopant to diffuse out of the SiC into the underlying solar cell to form an emitter or field. The embodiment of FIG. 8 may be combined with other embodiments disclosed herein.

Figure 9:
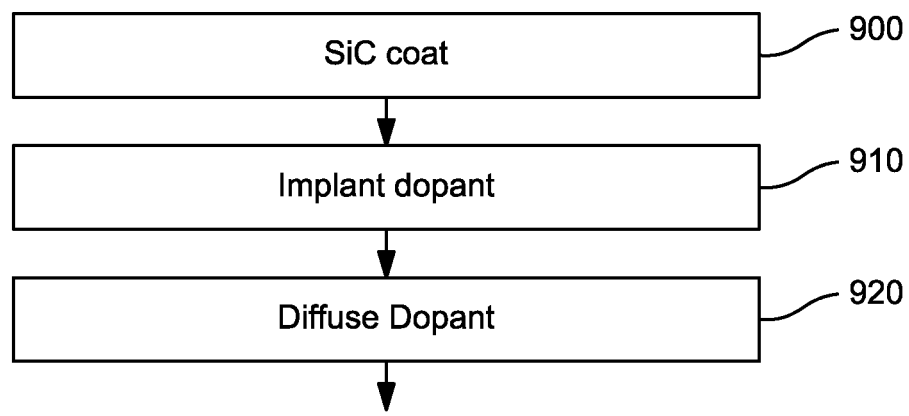
FIG. 9 is a process flow of a ninth embodiment of solar cell fabrication.

FIG. 9 is a process flow of a ninth embodiment of solar cell fabrication. The SiC-forming polymer is also used as a diffusion source in this embodiment. The dopant can be extrinsically added to the SiC-forming polymer using ion implantation. Thus, the SiC-forming polymer is implanted after it is applied to the solar cell. In this embodiment, the SiC-forming polymer is applied in a pattern on the solar cell in step 900. The polymer is then implanted with dopant in step 910. A thermal treatment 920 is then performed. The thermal process causes SiC to be formed and causes the dopant to diffuse out of the SiC into the underlying solar cell to form an emitter or field. The embodiment of FIG. 9 may be combined with other embodiments disclosed herein.

In yet another embodiment, the SiC-forming polymer is used as an etch mask. The SiC-forming polymer is applied to the solar cell in a pattern that matches the desired etch pattern. After thermally setting the SiC-forming polymer, the exposed silicon of the solar cell is etched in a wet bath. The SiC masks the etch, while passivating the surface. For example, grooved contacts may be formed using this embodiment. Any trenches formed using the etch may be doped and metallized. The metal can be below the surface of the solar cell in this instance, which lowers series resistance without increasing shadowing.

Various embodiments disclosed herein can include firing contacts with the anneal step. This reduces the number of process steps required to manufacture the solar cell. Use of this SiC-forming polymer may eliminate the need for PECVD, which also reduces manufacturing costs. A single step passivation and patterning may enable advanced solar cell designs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:
    implanting ions of a first species into a first surface of said workpiece to form a doped region;
    coating at least a portion of said first surface with a SiC forming polymer after said implanting;
    thermally treating said workpiece after said coating to anneal said doped region while forming SiC on said first surface; and
    applying a metal pattern on said first surface after said thermal treating,
    wherein said polymer is coated in a pattern on said first surface, and wherein said metal pattern is applied on portions of said first surface not coated with said polymer.

2. The method of claim 1, wherein said polymer is coated in a pattern on said first surface, and further comprising implanting ions of a second species into said first surface after said coating and before said thermal treating, wherein said polymer act as a mask, such that ions of said second species are implanted into said first surface in portions of said first surface not coated with said polymer.

3. The method of claim 2, wherein said second species has a different conductivity than said first species.

4. The method of claim 2, wherein said second species has a same conductivity as said first species.

5. The method of claim 1, further comprises:
    processing a second surface of said workpiece after said implanting and coating.

6. The method of claim 5, wherein said thermal treating is performed after said processing.

7. The method of claim 6, wherein said thermal treating is performed in the presence of oxygen to form an oxide on said second surface.

8. The method of claim 1, wherein said SiC forming polymer is coated using a spray coater.

9. The method of claim 1, wherein said SiC forming polymer is coated using a screen printer.

10. The method of claim 1, wherein said SiC forms a passivation layer.

11. The method of claim 1, wherein said workpiece is processed to form a solar cell.

12. The method of claim 1, wherein all of said first surface is coated with said polymer, and wherein said metal pattern is applied using a fritted metal paste.

13. A method of processing a workpiece to form a solar cell, comprising:
- implanting ions of a first species into a first surface of said workpiece to form a doped emitter region;
- coating a portion of said first surface with a SiC forming polymer after said implanting, wherein said polymer is coated in a pattern on said first surface;
- thermally treating said workpiece after said coating to anneal said doped emitter region while forming a passivation layer comprising SiC on said first surface; and
- applying a metal pattern on portions of said first surface not coated with said SiC forming polymer.

* * * * *